United States Patent
Hummler et al.

(10) Patent No.: US 6,586,300 B1
(45) Date of Patent: Jul. 1, 2003

(54) SPACER ASSISTED TRENCH TOP ISOLATION FOR VERTICAL DRAM'S

(75) Inventors: Klaus M. Hummler, Poughkeepsie, NY (US); Arnd R. Scholz, Dresden (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/125,118

(22) Filed: Apr. 18, 2002

(51) Int. Cl.[7] .................... H01L 21/8242; H01L 21/20
(52) U.S. Cl. .................. 438/242; 438/243; 438/247; 438/249; 438/386; 438/387
(58) Field of Search ................. 438/206, 242, 438/248, 282, 400, 404, 244, 240, 249, 386, 387, 392; 257/301, 296, 309, 330, 315, 333

(56) References Cited

U.S. PATENT DOCUMENTS

| | | | |
|---|---|---|---|
| 5,641,694 A | * 6/1997 | Kenney | 438/156 |
| 6,074,909 A | * 6/2000 | Gruening | 438/242 |
| 6,110,792 A | * 8/2000 | Bronner et al. | 438/386 |
| 6,225,158 B1 | * 5/2001 | Furukawa et al. | 438/243 |
| 6,255,683 B1 | * 7/2001 | Radens et al. | 257/301 |
| 6,352,892 B2 | * 3/2002 | Jammy et al. | 438/244 |
| 6,373,086 B1 | * 4/2002 | Mandelman et al. | 257/301 |
| 6,376,324 B1 | * 4/2002 | Mandelman et al. | 438/386 |
| 6,404,000 B1 | * 6/2002 | Divakaruni et al. | 257/296 |
| 6,406,970 B1 | * 6/2002 | Kudelka et al. | 438/386 |
| 6,423,607 B1 | * 7/2002 | Heineck et al. | 438/386 |
| 6,426,253 B1 | * 7/2002 | Tews et al. | 438/243 |
| 6,426,526 B1 | * 7/2002 | Divakaruni et al. | 257/302 |
| 6,437,388 B1 | * 8/2002 | Radens et al. | 257/301 |
| 6,440,793 B1 | * 8/2002 | Divakaruni et al. | 438/243 |
| 6,509,599 B1 | * 1/2003 | Wurster et al. | 257/301 |
| 6,518,616 B2 | * 2/2003 | Dyer et al. | 257/301 |
| 2002/0089007 A1 | * 7/2002 | Divakaruni et al. | 257/302 |
| 2002/0190298 A1 | * 12/2002 | Alsmeier et al. | 257/301 |

* cited by examiner

*Primary Examiner*—Michael S. Lebentritt
(74) *Attorney, Agent, or Firm*—Slater & Matsil, L.L.P.

(57) ABSTRACT

A trench top isolation (TTI) layer (148) and method of forming thereof for a vertical DRAM. A first assist layer (134) is disposed over trench sidewalls (133) and trench capacitor top surfaces (131). A second assist layer (136) is disposed over the first assist layer (134). The second assist layer (136) is removed from over the trench capacitor top surface (131), and the first assist layer (134) is removed from the trench capacitor top surface (131) using the second assist layer (136) as a mask. The second assist layer (136) is removed, and a first insulating layer (140) is disposed over the first assist layer (134) and trench capacitor top surface (131). A second insulating layer (142) is disposed over the first insulating layer (140), and the second insulating layer (142) is removed from the trench sidewalls (133). The first insulating layer (140) and the first assist layer (134) are removed from the trench sidewalls (133). The TTI layer (148) comprises the first and second insulating layer portions (146/144) that are left remaining over the trench capacitors (118). The TTI layer (148) has a greater thickness over the trench capacitor inner regions (152) than over the trench capacitor outer regions (150).

21 Claims, 3 Drawing Sheets

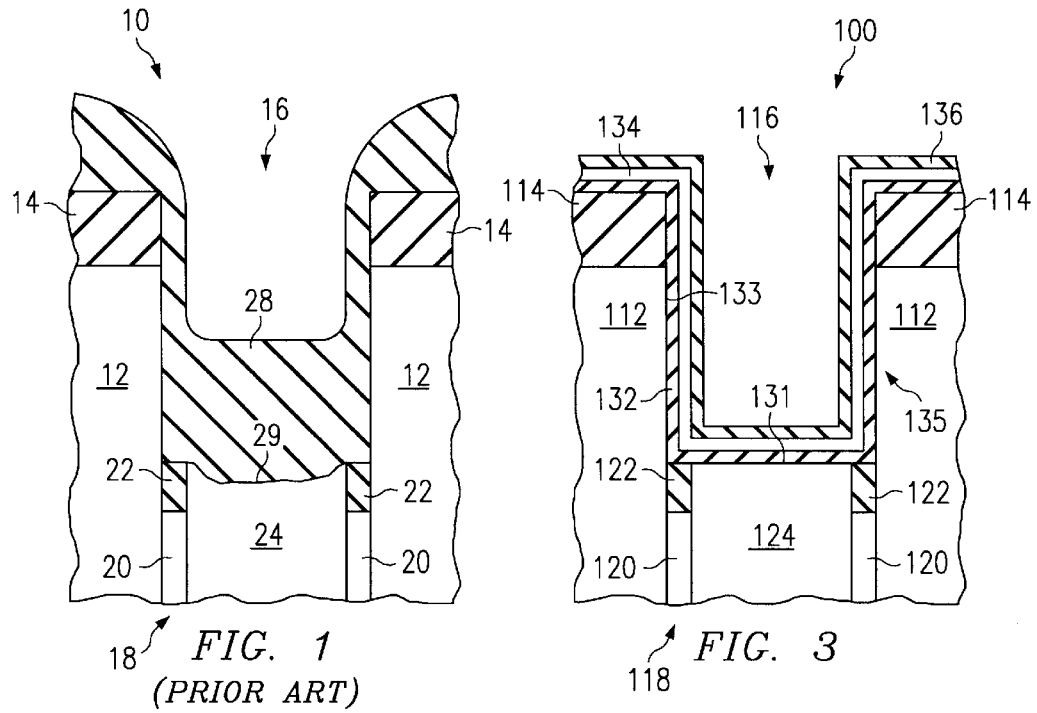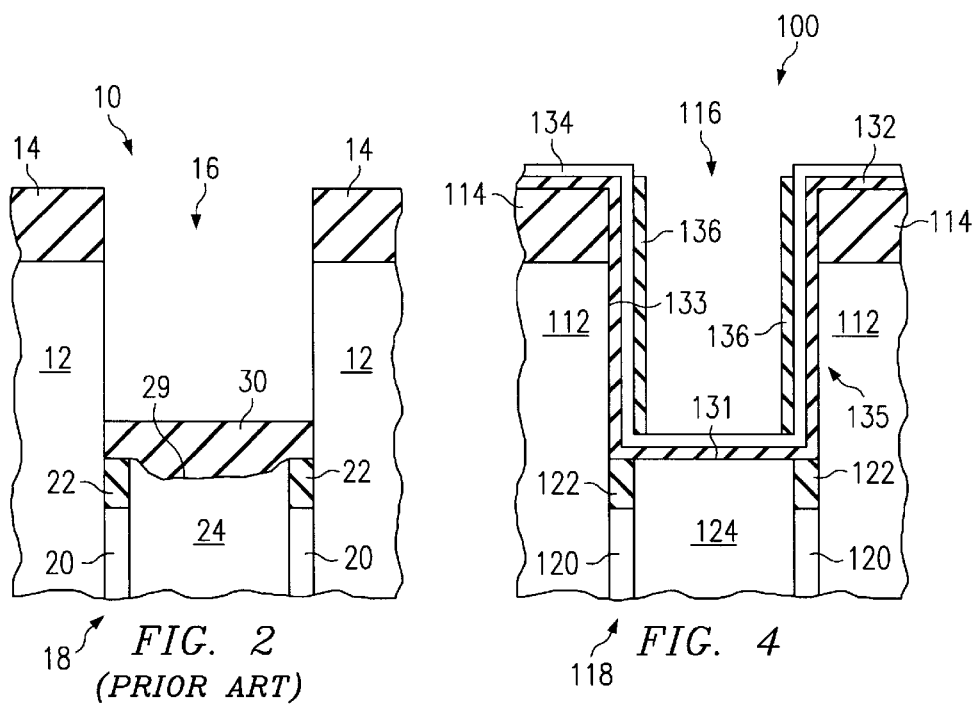

US 6,586,300 B1

SPACER ASSISTED TRENCH TOP ISOLATION FOR VERTICAL DRAM'S

TECHNICAL FIELD

The present invention relates generally to the fabrication of integrated circuits (IC's), and more particularly to the fabrication of memory IC's.

BACKGROUND

Semiconductor devices are used in a variety of electronic applications, such as personal computers and cellular phones, for example. One such semiconductor product widely used in electronic systems for storing data is a semiconductor memory, and a common type of semiconductor memory is a dynamic random access memory (DRAM).

A DRAM typically includes millions or billions of individual DRAM cells arranged in an array, with each cell storing one bit of data. A DRAM memory cell typically includes an access field effect transistor (FET) and a storage capacitor. The access FET allows the transfer of data charges to and from the storage capacitor during reading and writing operations. In addition, the data charges on the storage capacitor are periodically refreshed during a refresh operation.

DRAM storage capacitors are typically formed by etching deep trenches in a semiconductor substrate, and depositing and patterning a plurality of layers of conductive and insulating materials over the substrate in order to produce a storage capacitor that is adapted to store data, represented by a one or zero. Prior art DRAM designs typically comprise an access FET disposed in a subsequently deposited layer, disposed above and to the side of the storage capacitor.

The semiconductor industry in general is being driven to decrease the size of semiconductor devices located on integrated circuits. Miniaturization is generally needed to accommodate the increasing density of circuits necessary for today's semiconductor products. Decreasing the size of DRAM's creates manufacturing challenges.

More recent DRAM designs involve disposing the access FET directly above the storage capacitor, sometimes referred to as a vertical DRAM, which saves space by conserving surface area, and results in the ability to place more DRAM cells on a single chip. In vertical DRAM technology, the isolation layer between the deep trench (DT) fill and the vertical gate oxide in the upper part of the deep trench is often referred to as trench top oxide (TTO).

It is desirable for trench top oxide to have a very well controlled thickness. If the trench top oxide is too thin, shorts or reliability failures in the memory cell will occur. If the trench top oxide is too thick, the buried strap (BS) out-diffusion cannot bridge the trench top oxide, resulting in the loss of device overlap.

What is needed in the art is process of forming trench top isolation for vertical DRAM's that results in the trench top isolation having a well-controlled thickness.

SUMMARY OF THE INVENTION

Embodiments of the present invention achieve technical advantages as a novel trench top isolation layer for a vertical DRAM device, and a method of forming thereof.

In one embodiment, a vertical DRAM device is disclosed. The device includes a workpiece that comprises a semiconductor substrate, a plurality of trenches formed in the workpiece, and a plurality of trench capacitors formed in the trench bottom portion. The capacitors include a buried strap in the outer region and a capacitor inner plate in the inner region. The vertical DRAM device includes a trench top isolation (TTI) layer formed over the trench capacitors in the trench top portion, wherein the trench top isolation layer has a greater thickness over the capacitor inner region than over the capacitor outer region.

Also disclosed is a method of forming a trench top isolation layer of a vertical DRAM device. The method includes providing a workpiece, the workpiece comprising a substrate having a plurality of trenches formed therein, wherein a trench capacitor is formed in each trench bottom portion. The method includes forming a TTI layer in the trench top portion over the trench capacitors, wherein the trench top isolation layer has a greater thickness over the capacitor inner region than over the capacitor outer region.

Further disclosed is method of manufacturing a vertical DRAM device. The method includes providing a workpiece, forming a plurality of trenches in the workpiece, forming a trench capacitor in each trench bottom portion, and disposing a first assist layer over at least the trench sidewalls and trench capacitor top surfaces. A second assist layer is disposed over the first assist layer, the second assist layer is removed from over at least the trench capacitor top surface, and the first assist layer is removed from at least the trench capacitor top surface using the second assist layer as a mask, leaving a portion of the workpiece at the trench sidewalls exposed proximate the trench capacitor top surface. The method includes removing the second assist layer, disposing a first insulating layer over at least the first assist layer and the trench capacitor top surface, the first insulating layer being conformal, and disposing a second insulating layer over the first insulating layer. The second insulating layer is removed from at least the trench sidewalls, leaving a portion of the second insulating layer over the trench capacitor top surface, and the first insulating layer and the first assist layer are removed from the trench sidewalls, leaving a portion of the first insulating layer disposed over the trench capacitor top surface. The remaining portions of the first and second insulating layer form a TTI layer of the vertical DRAM device.

A method of processing a semiconductor device that includes at least one trench formed within a workpiece is further disclosed. The method includes forming a first component within a bottom portion of the trench, leaving an upper portion of the trench exposed, and forming a first sacrificial oxide over at least the trench sidewalls and the first component top surface. A first assist layer is disposed over the first sacrificial oxide, wherein the first assist layer comprises a semiconductor material. A second assist layer is disposed over the first assist layer, wherein the second assist layer comprises an oxide. The second assist layer is removed from at least over the first component top surface, leaving portions of the second assist layer remaining over the trench sidewalls. The second assist layer is used as a mask to remove the first assist layer from at least over the first component top surface, leaving the first assist layer over at least a portion of the trench sidewalls. The second assist layer is removed from the trench sidewalls, and a first insulating material is deposited over the first assist layer and the first component top surface, wherein the first insulating material comprises a nitride. A second insulating material is deposited over the first insulating material, wherein the second insulating material comprises an oxide. The method includes removing the second insulating material from at least the trench sidewalls, and removing the first insulating material and first assist layer from a top portion of the trench sidewalls, wherein the second insulating material and first insulating material remaining over the first component comprise a TTI layer.

Advantages of embodiments of the invention include providing a TTI layer and method of forming thereof, wherein the TTI layer has a well-controlled thickness. The TTI layer is thicker over the inner region of the underlying storage capacitor, improving the insulative properties of the TTI layer in the central region. The TTI layer is thinner over the outer region of the storage capacitor, which improves the source diffusion across the TTI layer. In addition, the TTI layer formation is self-aligned. Furthermore, the process allows the ability to implant dopants into the workpiece prior to forming the TTI layer, providing TTI layer extension diffusion.

BRIEF DESCRIPTION OF THE DRAWINGS

The above features of embodiments of the present invention will be more clearly understood from consideration of the following descriptions in connection with accompanying drawings in which:

FIGS. 1–2 illustrate cross-sectional views of a prior art method of forming trench top oxide of a vertical DRAM device; and FIGS. 3–10 illustrate cross-sectional views of a manufacturing process for forming a trench top isolation layer of a vertical DRAM device in various stages in accordance with an embodiment of the present invention.

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

Figure 5:
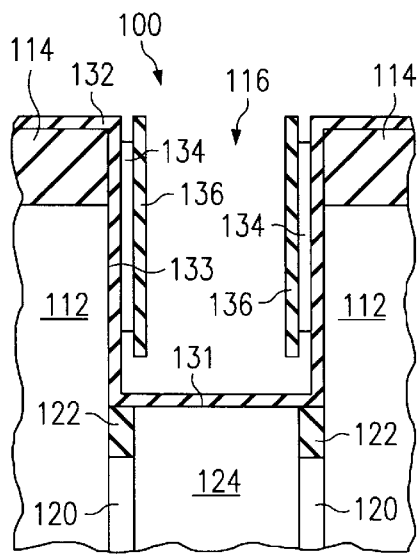

Problems with prior art trench top oxide formation will be discussed, followed by a description of some preferred embodiments of the present invention and some advantages thereof. A cross-section of one memory cell is shown in each figure, although many other memory cells and components of memory cells may be present in the semiconductor devices shown.

In vertical DRAM processing, trench top oxide is often formed by a high density plasma (HDP) oxide deposition, followed by an etch-back of the HDP oxide from the deep trench sidewalls, as shown in FIGS. 1 and 2. FIG. 1 shows a vertical DRAM device 10 after a pad nitride 14 has been deposited over a substrate 12, and deep trenches 16 have been formed in the wafer. A storage capacitor 18 has been formed within the bottom portion of the deep trench. The storage capacitor 18 includes a collar oxide 20, buried strap 22 and capacitor inner plate 24, for example. A buried plate may be disposed in the lower part of the trench (not shown). To form the TTO over the top surface of the storage capacitor 18, HDP oxide 28 is deposited over the wafer. Due to the anisotropic deposition properties of HDP oxide, more oxide 28 is deposited over the top of the wafer and within the bottom of the trenches 16, as compared with the thinner portion of oxide 28 deposited over the sidewalls of the trenches, as shown in FIG. 1.

The wafer is exposed to a uniform etch process. Because the HDP oxide 28 is thicker in the bottom of the trenches 116 than on the trench sidewalls, the HDP oxide 28 is completely removed from the trench sidewalls, leaving a layer of TTO 30 disposed over the storage capacitor 18, as shown in FIG. 2. The HPD oxide 30 remaining over the storage capacitors 18 has a uniform thickness.

A problem with the prior art process for forming TTO 30 shown in FIGS. 1 and 2 is that the HDP oxide 28 deposition and etch back process results in a high degree of variability in the trench top isolation 30 thickness, caused not only by the deposition step, but also resulting from the underlying, e.g., uneven, topography of the storage capacitor top surface 29 inside the deep trench before the trench top oxide deposition. If the TTO 30 is too thin, this will result in shorts or reliability failures in the DRAM cell 10. If the TTO 30 is too thick, the buried strap 22 outdiffusion is unable to bridge the TTO 30, resulting in the loss of device overlap and causing failures.

Embodiments of the present invention achieve technical advantages as a TTI layer and method of forming thereof. The TTI layer includes a first and second material, and is formed using two assist layers. The TTI layer has a well-controlled thickness and is thicker in the central region than at the outer region.

FIGS. 3–10 show cross-sectional views of a vertical DRAM 100 in various stages of manufacturing in accordance with a preferred embodiment of the invention. Shown in FIG. 3, a semiconductor wafer workpiece 112 comprising a substrate is provided. The workpiece 112 typically comprises a semiconductor material such as single-crystal silicon, and may include other conductive layers or other semiconductor elements such as transistors or diodes, as examples. The workpiece 112 may alternatively comprise semiconductors such as GaAs, InP, Si/Ge, SiC, or compound semiconductors, as examples.

A pad nitride 114 may be deposited over the semiconductor substrate 112. The pad nitride 114 preferably comprises silicon nitride deposited in a thickness of 100–300 nm, as an example. Alternatively, pad nitride 114 may comprise other nitrides or oxides, as examples.

A plurality of trenches 116 is formed in the workpiece 112. The trenches 114 may have a high aspect ratio, e.g., the depth may be much greater than the width. For example, trenches 114 may be 200 nm wide and 8 μm deep below the top surface of the workpiece 112. Trenches 114 may have an oval shape when viewed from the top surface of the wafer, and alternatively, trenches 114 may comprise other shapes, such as square, rectangular, or circular, as examples. Trenches 114 may form a storage node or capacitor of a memory cell, such as in a DRAM, for example.

A buried plate is formed, and a node dielectric is formed (not shown). The trenches are filled with collar oxide 120, and the trenches are filled with a semiconductor material such as polysilicon, to form the capacitor inner plate 124 and buried strap 122. The semiconductor material is etched back to leave the structure shown in FIG. 3, with the capacitor inner plate top surface 131 and buried strap 122 being etched back to a predetermined distance below the workpiece 112 surface.

A first sacrificial oxide layer 132 is formed over the wafer within the trenches 116, as shown in FIG. 3. The first sacrificial oxide layer 132 is thin, e.g., around 30 to 50 Angstroms thick, and may comprise $SiO_2$ formed by thermal oxidation, as an example.

A first assist layer 134 is disposed over trench sidewalls and trench capacitor top surfaces, over the first sacrificial oxide 132. The first assist layer 134 preferably comprises a thin layer of semiconductor material. The first assist layer 134 functions as a spacer to control the thickness of the TTI layer 146 that will be formed (see FIG. 9). The thickness of the first assist layer 134 is approximately the same as the target thickness of the first insulating layer 146 of the TTI layer 148.

The first assist layer 134 preferably comprises intrinsic polysilicon, and may alternatively comprise amorphous silicon or other semiconductor materials, as examples. The first assist layer 134 preferably comprises a thickness of less than half the trench 118 width, and may comprise a thickness of 150 to 300 Angstroms, for example. The first assist layer 134 may be formed by chemical vapor deposition (CVD) or other deposition methods, as examples. The first assist layer 134 is preferably undoped to avoid contaminating the channel region 135.

A second assist layer 136 is disposed over the first assist layer 134. The second assist layer 136 preferably comprises a thin oxide spacer, e.g., comprising $SiO_2$ and alternatively comprising other oxide materials, as examples. The second assist layer 136 may be, for example, 100–300 Angstroms thick, and may be formed by CVD, PVD or other oxide formation methods.

The wafer is exposed to an anisotropic etch to remove the second assist layer 136 from over the trench capacitor top surface 131, as shown in FIG. 4. The etch process preferably leaves the second assist layer 136 remaining on the trench sidewalls 133, while removing the second assist layer 136 from the bottom of the trenches over the capacitor inner plate top surface 131. The etch process may comprise a high ion bombardment etch, for example.

The second assist layer 136 is used as a mask to pattern the first assist layer 134, as shown in FIG. 5. The wafer is exposed to a selective etch process, to remove the first assist layer 134 material in areas where the first assist layer 134 is not protected by second assist layer 136. For example, first assist layer 134 is left remaining on the trench sidewalls 133, while the first assist layer 134 over the capacitor top surface 131 is removed. Preferably, a portion of the second assist layer 136 is removed from the trench sidewalls 133 in the area above the buried strap 122, as shown, during the etch process for the first assist layer 134. Preferably, the second assist layer etch process is selective to oxide, for example. The second assist layer etch preferably comprises a wet etch and/or an isotropic etch, as examples.

Figure 6:
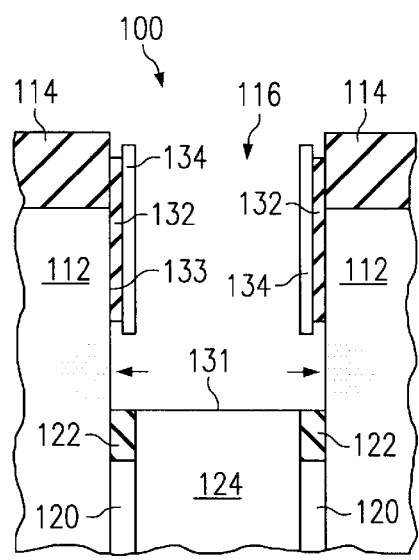

After the first assist layer 134 is removed from the trench capacitor top surface using the second assist layer 136 as a mask, the second assist layer is removed from the trench sidewalls, as shown in FIG. 6. Because the sacrificial oxide 132 also comprises an oxide, the sacrificial oxide 132 is also removed when the second assist layer 136 is removed.

At this point in the process flow, the workpiece 112 is left exposed in a region above the buried strap 122. In one embodiment of the invention, a dopant may be implanted into the workpiece, to provide a buried strap extension, diffused into the semiconductor material of the workpiece. The dopant implant may be by gas phase doping or solid source doping, as examples. The dopant may comprise arsenic, phosphorous, or may alternatively comprise other dopants, as examples. The dopant implant is advantageous by forming an extension of the source diffusion, assisting the bridging of the TTI layer. Advantageously, this interim step of the TTI layer formation method in accordance with embodiments of the present invention leaves the workpiece 112 exposed, allowing the optional introduction of dopants into the workpiece 112 proximate the buried strap 122.

Figure 7:
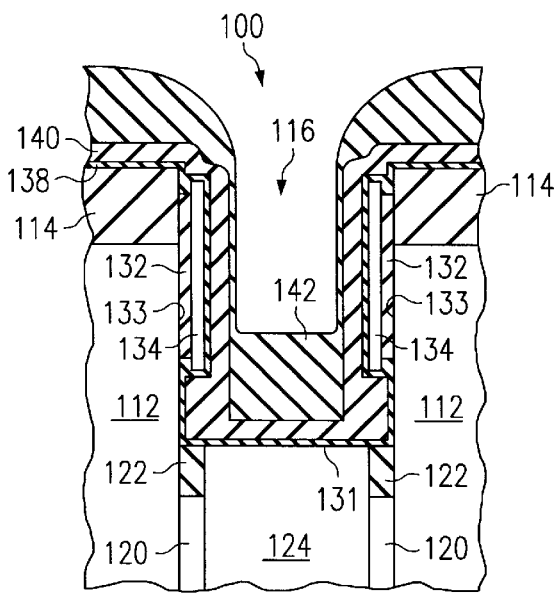

A second oxide layer 138 is formed over the wafer, by a thermal oxidation, as example, as shown in FIG. 7. The second oxide layer 138 preferably comprises around 20–30 Angstroms of an oxide, as an example.

A first insulating layer 140 is disposed over the first assist layer 134 and trench capacitor top surface 131. The first insulating layer 140 preferably comprises a nitride, such as SiN, as an example, although the first insulating layer 140 may alternatively comprise other nitrides. The first insulating layer 140 is preferably conformal, and may be formed by CVD, as an example. The first insulating layer 140 preferably evenly lines the trench, lining the trench sidewalls 133, the capacitor top surface 131, and the buried strap 122. Preferably, the first insulating layer 140 completely fills the region below the first assist layer 134, proximate the exposed workpiece 112 (which, optionally, has been implanted with a dopant).

A second insulating layer 142 is disposed over the first insulating layer 140. The second insulating material 142 preferably comprises a different material than the first insulating material 140. The second insulating layer 142 preferably comprises an oxide deposited in an anisotropic deposition process, and more preferably, the second insulating layer comprises an HDP oxide. Preferably, more oxide 142 is formed on the bottom of the trenches (e.g., over the capacitor top surface 131) than on the sidewalls 133, as shown.

Figure 8:
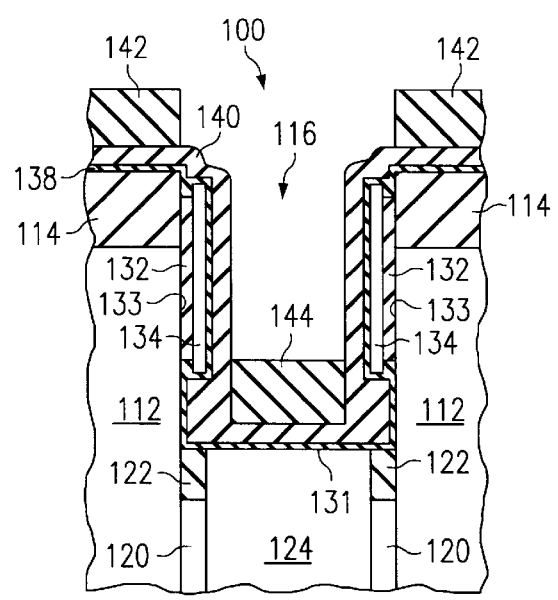

The second insulating layer 142 is removed from the trench sidewalls 133, as shown in FIG. 8. This may be accomplished with a uniform etch process, as an example, because more second insulating layer 142 is disposed over the capacitor top surface 131 than on the trench sidewalls 133. A portion 144 of the second insulating layer 142 is left remaining over the first insulating layer 140 over the capacitor top surface 131, as shown.

Figure 9:
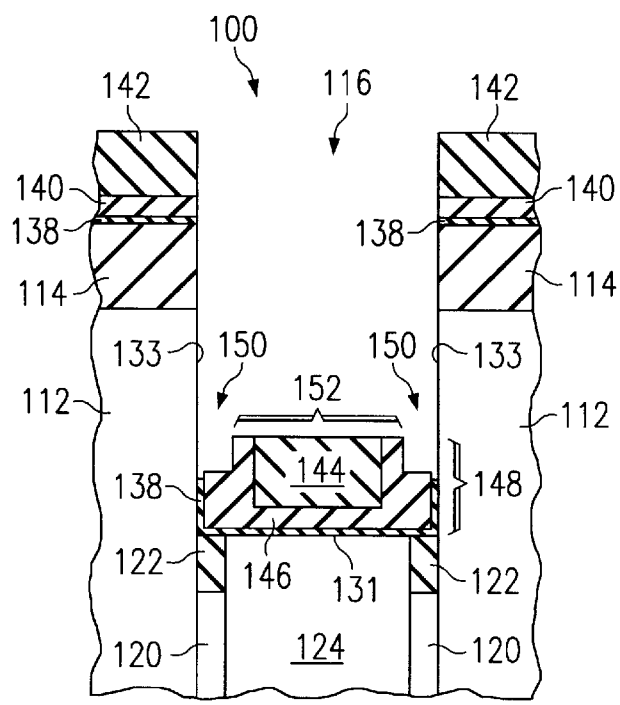

The first insulating layer 140, the first assist layer 134, and the first sacrificial oxide 132 are removed from the trench sidewalls 133, leaving a portion 146 of the first insulating layer 140 remaining over the capacitor top surface 131 and buried strap 122, as shown in FIG. 9. The TTI layer 148 comprises the first and second insulating layer portions 146/144 that are left remaining over the trench capacitor top surface 131.

Advantageously, the TTI layer 148 has a greater thickness over the trench capacitor inner regions 152 than over the trench capacitor outer regions 150. The TTI layer 148 over the capacitor inner region 152 may comprise about 200 to 400 Angstroms, and the TTI layer 148 over the capacitor outer region 150 may comprise about 150 to 300 Angstroms, as examples.

Figure 10:
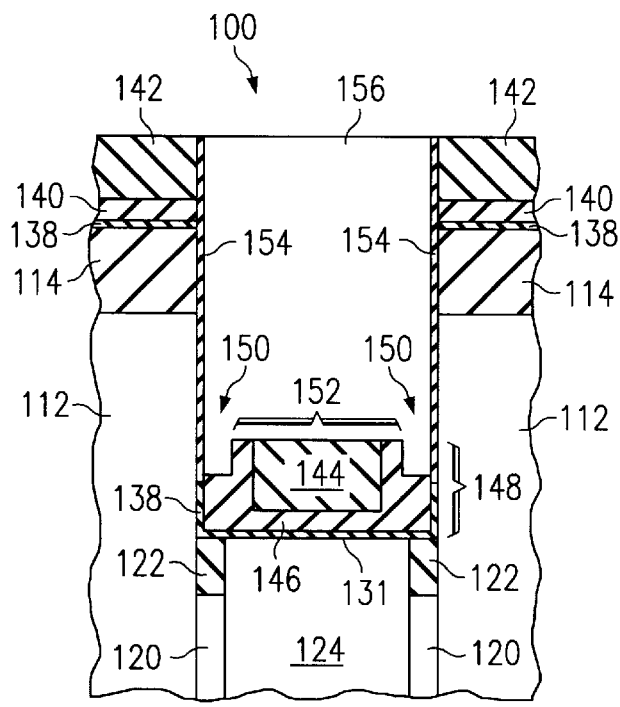

Further processing is continued to complete the vertical DRAM 100. For example, a gate oxide 154 may be formed over the trench sidewalls, and a semiconductor material may be deposited to form a gate electrode 156, as shown in FIG. 10.

Advantages of embodiments of the invention include providing a TTI layer 148 and method of forming thereof, wherein the TTI layer 148 has a well-controlled thickness. The processes used to etch back the first insulating layer 146 are well-controllable processes. The thickness of the TTI layer 148 is controlled by the thickness of the first assist layer 134. In particular, the first assist layer 134 acts as a spacer to control the thickness of the first insulating layer 146 disposed over the capacitor outer region 150.

The TTI layer 148 disclosed herein comprising a first insulating layer 146 and second insulating layer 144 is advantageous. The first insulating layer 146 creates a large process margin for the etch-back of the second insulating layer 144.

Furthermore, the TTI layer 148 is thicker over the inner region 152 of the underlying storage capacitor 118, improving the insulative properties of the TTI layer 148 in the central region 152. The TTI layer 148 is thinner over the outer region 150 of the storage capacitor 118, which improves the source diffusion across the TTI layer 148.

In addition, the TTI layer 148 formation is self-aligned. Furthermore, the process allows the ability to implant dopants into the workpiece prior to forming the TTI layer, providing TTI layer extension diffusion.

While embodiments of the present invention are described herein with reference to DRAM devices, they also have useful application in ferroelectric random access memory (FRAM) devices and other semiconductor devices.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of embodiments of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of forming a trench top isolation layer of a vertical dynamic random access memory (DRAM) device, comprising:
   providing a workpiece, the workpiece comprising a substrate having a plurality of trenches formed therein, each trench having a top portion and a bottom portion, wherein a trench capacitor is formed in each trench bottom portion, the trench capacitors including an outer region and a inner region, each trench capacitor including a buried strap in the outer region and a capacitor inner plate in the inner region; and
   forming a trench top isolation (TTI) layer in the trench top portion over the trench capacitors, wherein the trench top isolation layer has a greater thickness over the capacitor inner region than over the capacitor outer region.

2. The method according to claim 1, wherein forming the TTI layer comprises:
   disposing a first insulating material over the trench capacitors; and
   disposing a second insulating material over the first insulating material, wherein the second insulating material comprises a different material than the first insulating material.

3. The method according to claim 2, wherein disposing a first insulating material comprises disposing a nitride, and wherein disposing a second insulating material comprises disposing an oxide by high-density plasma (HDP).

4. The method according to claim 1, wherein the trenches comprise sidewalls and wherein the trench capacitors comprise a top surface, wherein forming a TTI layer comprises:
   disposing a first assist layer over the trench sidewalls and trench capacitors;
   disposing a second assist layer over the first assist layer;
   removing the second assist layer from at least the trench capacitor top surface;
   removing the first assist layer from at least the trench capacitor top surface using the second assist layer as a mask to leave a portion of the workpiece exposed proximate the trench capacitor top surface;
   removing the second assist layer;
   disposing a first insulating layer over the first assist layer and the trench capacitor top surface;
   disposing a second insulating layer over the first insulating layer, the second insulating layer having a greater thickness over the trench capacitor top surface than on the trench sidewalls;
   removing the second insulating layer from at least the trench sidewalls, leaving a portion of the second insulating layer over the first insulating layer; and
   removing the first insulating layer and the first assist layer from the trench sidewalls, leaving a portion of the first insulating layer disposed over the trench capacitor top surfaces, wherein the remaining portions of the first and second insulating layer over the trench capacitor top surfaces form the TTI layer.

5. The method according to claim 4, wherein removing the first assist layer comprises:
   removing a portion of the second assist layer from the trench sidewalls proximate the trench capacitor top surface; and
   removing a portion of the first assist layer from beneath the second assist layer, proximate the exposed workpiece portions.

6. The method according to claim 4, wherein disposing the first assist layer comprises disposing a semiconductor material, wherein disposing the first insulating layer comprises disposing a nitride, and wherein disposing the second assist layer and second insulating layer comprise disposing an oxide.

7. The method according to claim 4, further comprising doping the exposed workpiece portions to form buried strap outdiffusion regions in the workpiece proximate the buried strap.

8. The method according to claim 1, further comprising forming an oxide layer on the workpiece, before forming the TTI layer.

9. A method of manufacturing a vertical dynamic random access memory (DRAM) device, comprising:
   providing a workpiece, the workpiece including a substrate;
   forming a plurality of trenches in the workpiece, each trench having a top portion, a bottom portion, and sidewalls;
   forming a trench capacitor in each trench bottom portion, the trench capacitors having a top surface;
   disposing a first assist layer over at least the trench sidewalls and trench capacitor top surfaces;
   disposing a second assist layer over the first assist layer;
   removing the second assist layer from over at least the trench capacitor top surface;
   removing the first assist layer from at least the trench capacitor top surface using the second assist layer as a mask, leaving a portion of the workpiece at the trench sidewalls exposed proximate the trench capacitor top surface;

removing the second assist layer;

disposing a first insulating layer over at least the first assist layer and the trench capacitor top surface, the first insulating layer being conformal;

disposing a second insulating layer over the first insulating layer;

removing the second insulating layer from at least the trench sidewalls, leaving a portion of the second insulating layer over the trench capacitor top surface; and removing the first insulating layer and the first assist layer from the trench sidewalls, leaving a portion of the first insulating layer disposed over the trench capacitor top surface, wherein the remaining portions of the first and second insulating layer form a trench top isolation (TTI) layer of the vertical DRAM device.

10. The method according to claim 9, wherein disposing the second insulating layer comprises disposing a second insulating layer having a greater thickness over the trench capacitor top surface than the thickness of the second insulating layer on the trench sidewalls.

11. The method according to claim 9, wherein removing the first assist layer comprises:

removing a portion of the second assist layer from the trench sidewalls proximate the trench capacitor top surface; and removing a portion of the first assist layer from beneath the second assist layer, proximate the exposed workpiece portions.

12. The method according to claim 11, wherein the trench capacitors include an outer region and an inner region, the capacitors including a buried strap in the outer region and a capacitor inner plate in the inner region, further comprising:

doping the exposed workpiece portions to form buried strap outdiffusion regions in the workpiece proximate the buried strap.

13. The method according to claim 9, wherein disposing the first assist layer comprises disposing a semiconductor material, wherein disposing the first insulating layer comprises disposing a nitride, and wherein disposing the second assist layer and second insulating layer comprise disposing an oxide.

14. The method according to claim 9, further comprising depositing an oxide layer on the workpiece, before forming the TTI layer.

15. The method according to claim 9, further comprising:

forming a gate oxide over exposed portions of the trench sidewalls; and disposing a semiconductor material over the trench top portion over the TTI layer to form a gate electrode.

16. The method according to claim 9, wherein the trench capacitors include an outer region and an inner region, wherein the TTI layer has a greater thickness over the capacitor inner region than over the capacitor outer region.

17. A method of processing a semiconductor device that includes at least one trench formed within a workpiece, the trench comprising sidewalls, the method comprising:

forming a first component within a bottom portion of the trench, leaving an upper portion of the trench exposed, the first component including a top surface;

forming a first sacrificial oxide over at least the trench sidewalls and the first component top surface;

disposing a first assist layer over the first sacrificial oxide, the first assist layer comprising a semiconductor material;

disposing a second assist layer over the first assist layer, the second assist layer comprising an oxide;

removing the second assist layer from at least over the first component top surface, leaving portions of the second assist layer remaining over the trench sidewalls;

using the second assist layer as a mask to remove the first assist layer from at least over the first component top surface, leaving the first assist layer over at least a portion of the trench sidewalls;

removing the second assist layer from the trench sidewalls;

depositing a first insulating material over the first assist layer and the first component top surface, the first insulating material comprising a nitride;

depositing a second insulating material over the first insulating material, the second insulating material comprising an oxide;

removing the second insulating material from at least the trench sidewalls; and removing the first insulating material, and first assist layer from a top portion of the trench sidewalls, wherein the second insulating material and first insulating material remaining over the first component comprise a trench top isolation (TTI) layer.

18. The method according to claim 17, further comprising forming a second component in the trench upper portion.

19. The method according to claim 17, wherein removing the second assist layer comprises removing portions of the first sacrificial oxide from the trench sidewalls, further comprising:

doping exposed portions of the workpiece within the trenches, after removing the second assist layer and portions of the first sacrificial oxide from the trench sidewalls; and forming a second oxide over at least the first component top surface and the trench sidewalls.

20. The method according to claim 17, wherein the semiconductor device comprises a vertical dynamic random access memory (DRAM), wherein the first component comprises a capacitor, and wherein the second component comprises a gate electrode.

21. The method according to claim 17, wherein the first component includes an outer region and an inner region, wherein the TTI layer has a greater thickness over the first component inner region than the thickness of the TTI layer over the first component outer region.

* * * * *